(12) United States Patent  
Chiu et al.

(10) Patent No.: US 8,502,718 B2  
(45) Date of Patent: Aug. 6, 2013

(54) ANALOG-TO-DIGITAL CONVERTER AND ANALOG-TO-DIGITAL CONVERSION METHOD

(75) Inventors: Jui-Te Chiu, Hsinchu (TW); Ching-Tzung Lin, Nantou (TW)

(73) Assignee: Fortemedia, Inc., Sunnyvale, CA (US)

( * ) Notice: Subject to any disclaimer, the term of this patent is extended or adjusted under 35 U.S.C. 154(b) by 451 days.

(21) Appl. No.: 13/017,548

(22) Filed: Jan. 31, 2011

(65) Prior Publication Data

US 2012/0128182 A1   May 24, 2012

Related U.S. Application Data

(63) Continuation-in-part of application No. 12/950,021, filed on Nov. 19, 2010.

(51) Int. Cl.
 *H03M 3/00* (2006.01)

(52) U.S. Cl.
 USPC ............ 341/143; 341/155; 381/120; 381/122

(58) Field of Classification Search
 USPC ........................ 341/143, 155; 381/120, 122
 See application file for complete search history.

(56) References Cited

U.S. PATENT DOCUMENTS

| | | | |
|---|---|---|---|
| 6,339,647 B1 * | 1/2002 | Andersen et al. | 381/312 |
| 6,593,866 B1 * | 7/2003 | Eastty et al. | 341/143 |
| 7,205,918 B2 * | 4/2007 | Niederdrank et al. | 341/143 |
| 7,295,141 B1 | 11/2007 | Wu et al. | |
| 7,365,664 B2 * | 4/2008 | Caduff et al. | 341/139 |
| 7,385,540 B2 | 6/2008 | Wu et al. | |
| 2008/0285770 A1 | 11/2008 | Wu et al. | |

* cited by examiner

*Primary Examiner* — Khai M Nguyen  
(74) *Attorney, Agent, or Firm* — McClure, Qualey & Rodack, LLP

(57) ABSTRACT

The invention provides an analog-to-digital converter. In one embodiment, the analog-to-digital converter receives a first audio signal from a microphone sensor, and receives a first channel selection signal and a clock signal, and comprises a toggle detection module, a first data processing module, a second data processing module, and a multiplexer. The toggle detection module detects whether the first channel selection signal is toggling between a logic low level and a logic high level to generate a control signal. The first data processing module processes the first channel selection signal to generate a second channel selection signal. The second data processing module converts the first audio signal from analog to digital to generate a second audio signal. If the control signal indicates that the first channel selection signal is toggling between the logic low level and the logic high level, the multiplexer outputs data bits of the second channel selection signal as an output signal of the analog-to-digital converter when the clock signal oscillates to the logic high level, and outputs data bits of the second audio signal as the output signal of the analog-to-digital converter when the clock signal oscillates to the logic low level.

18 Claims, 8 Drawing Sheets

| CS | Output Data | |
|---|---|---|
| | CLK Low | CLK High |
| 0 | Da | Tri-state |
| 1 | Tri-state | Da |
| Toggle | -CS | Da |

FIG. 6

ANALOG-TO-DIGITAL CONVERTER AND ANALOG-TO-DIGITAL CONVERSION METHOD

CROSS REFERENCE TO RELATED APPLICATIONS

This application is a Continuation-In-Part of pending U.S. patent application Ser. No. 12/950,021, filed Nov. 19, 2010 and entitled "Analog-to-digital converter and analog-to-digital conversion method", the content of which is hereby incorporated by reference in its entirety.

BACKGROUND OF THE INVENTION

1. Field of the Invention

The invention relates to signal processing, and more particularly to analog-to-digital conversion.

2. Description of the Related Art

Referring to FIG. 1, a schematic diagram of a sound processing device 150 comprising a microphone array is shown. In one embodiment, the sound processing device 150 comprises a plurality of microphone sensors 151~15n, a plurality of the analog-to-digital converters (ADC) 161~16n, and a digital signal processor 170. The microphone sensors 151~15n detect sound pressure at different locations to generate a plurality of analog audio signals Ka~Kn. The analog-to-digital converters 161~16n respectively convert the analog audio signals Ka~Kn from analog-to-digital to obtain a plurality of digital audio signals Da~Dn. The digital signal processor 170 then receives the digital audio signals Da~Dn and processes the digital audio signals Da~Dn to generate an output audio signal I.

To convert the analog audio signals Ka~Kn to digital audio signals Da~Dn, the sound processing device 150 requires the analog-to-digital converters 161~16n to serve as the circuit components thereof. If the analog-to-digital converters 161~16n have an efficient function design, they can lower the processing load of the digital signal processor 170. In addition, if the analog-to-digital converters 161~16n have a good output design, they can simplify the circuit integration between the output terminals of the analog-to-digital converters 161~16n and the input terminals of the digital signal processor 170. Thus, an analog-to-digital converter with an efficient design is required.

BRIEF SUMMARY OF THE INVENTION

The invention provides an analog-to-digital converter. In one embodiment, the analog-to-digital converter receives a first audio signal from a microphone sensor, and receives a first channel selection signal and a clock signal, and comprises a toggle detection module, a first data processing module, a second data processing module, and a multiplexer. The toggle detection module detects whether the first channel selection signal is toggling between a logic low level and a logic high level to generate a control signal. The first data processing module processes the first channel selection signal to generate a second channel selection signal. The second data processing module converts the first audio signal from analog to digital to generate a second audio signal. If the control signal indicates that the first channel selection signal is toggling between the logic low level and the logic high level, the multiplexer outputs data bits of the second channel selection signal as an output signal of the analog-to-digital converter when the clock signal oscillates to the logic high level, and outputs data bits of the second audio signal as the output signal of the analog-to-digital converter when the clock signal oscillates to the logic low level.

The invention provides an analog-to-digital conversion method. In one embodiment, an analog-to-digital converter comprises a toggle detection module, a first data processing module, a second data processing module, and a multiplexer. A first audio signal is received from a microphone sensor. A first channel selection signal and a clock signal are also received. Whether the first channel selection signal is toggling between a logic low level and a logic high level is then determined with a toggle detection module to generate a control signal. The first channel selection signal is then processed with the first data processing module to generate a second channel selection signal. The first audio signal is then converted from analog to digital with the second data processing module to generate a second audio signal. If the control signal indicates that the first channel selection signal is toggling between the logic low level and the logic high level, data bits of the second channel selection signal are output with the multiplexer as an output signal of the analog-to-digital converter when the clock signal oscillates to the logic high level, and data bits of the second audio signal are output with the multiplexer as the output signal of the analog-to-digital converter when the clock signal oscillates to the logic low level.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 6 shows output data of an analog-to-digital converter corresponding to different input values of a channel selection signal according to the invention;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
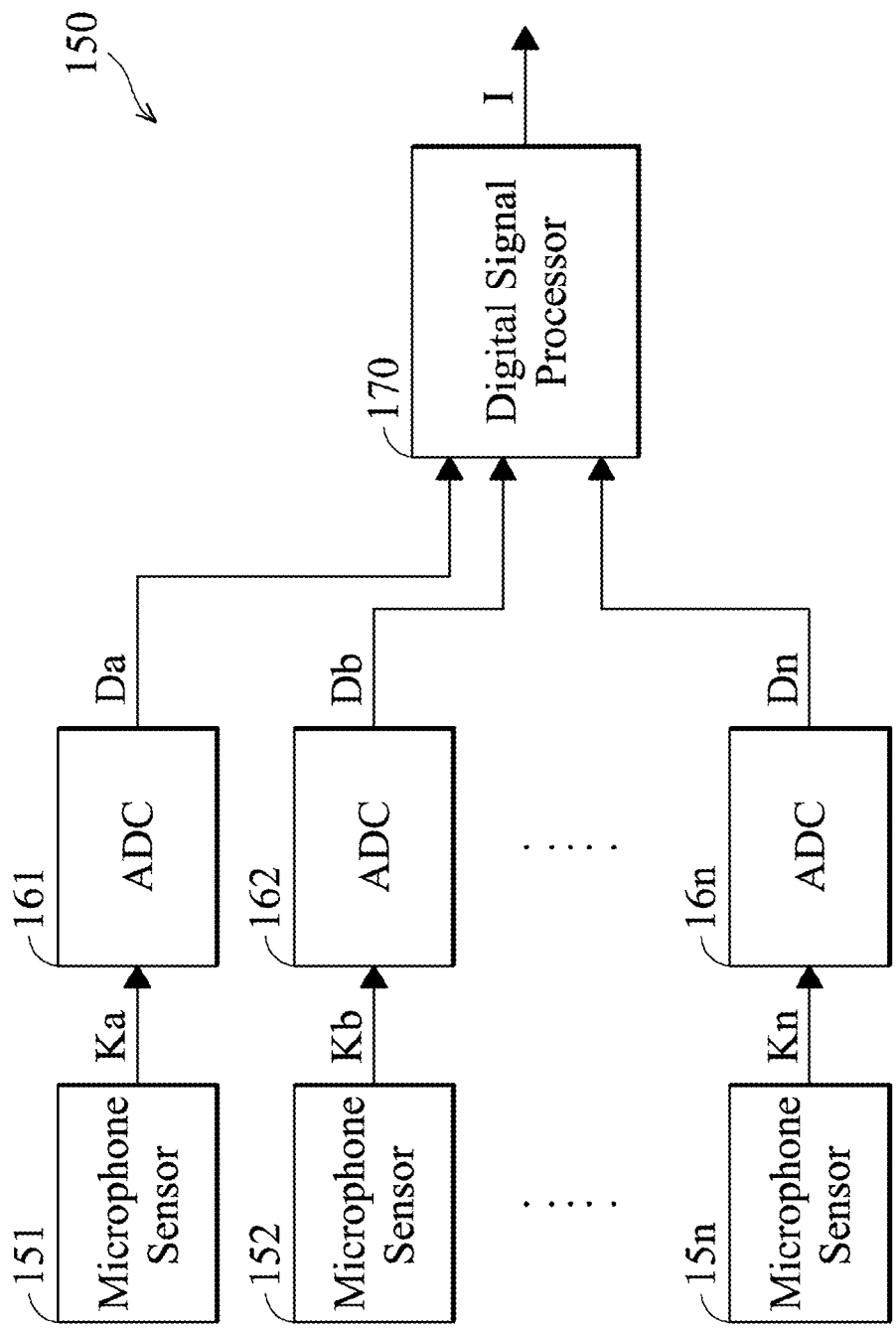
FIG. 1 is a schematic diagram of a sound processing device comprising a microphone array.
Figure 2:
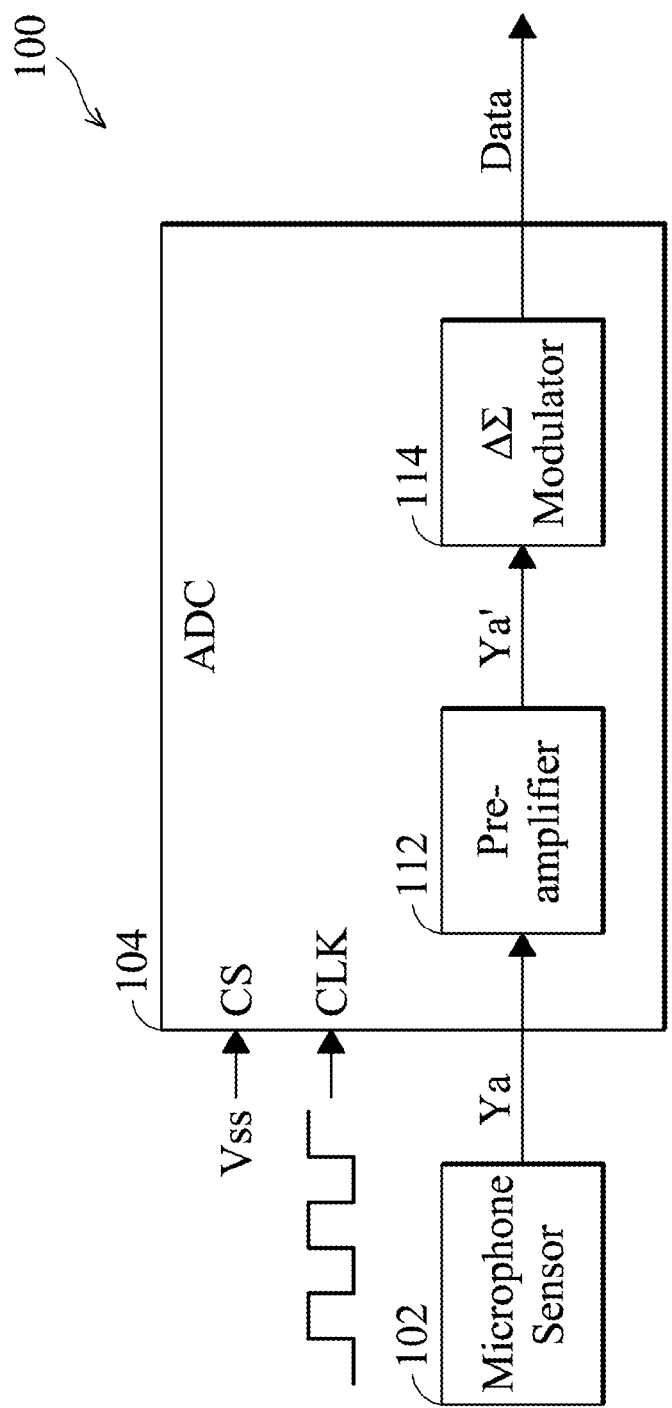
FIG. 2 is a block diagram of an analog-to-digital processor.

Referring to FIG. 2, a block diagram of an analog-to-digital processor 100 is shown. In one embodiment, the analog-to-digital converter 100 has three input terminals. A clock input terminal CLK receives a clock signal periodically oscillating between a logic high level and a logic low level. A channel selection input terminal CS is coupled to a voltage source Vdd or a ground voltage GND. The analog-to-digital converter 104 further receives an analog audio signal Ya from a microphone sensor 102. The analog-to-digital converter 104 comprises a pre-amplifier 112 and a ΔΣ modulator 114. The pre-amplifier 112 amplifies the analog audio signal Ya to obtain an amplified audio signal Ya'. The ΔΣ modulator 114 then converts the amplified audio signal Ya' from analog to digital to obtain a digital audio signal. The voltage level of the channel selection signal CS determines a signal output format of the analog-to-digital converter 104. If the channel selection input terminal CS is coupled to the voltage source Vdd, the analog-to-digital converter 104 outputs data bits of the digital audio signal when the clock signal CLK oscillates to a logic high level. If the channel selection input terminal CS is coupled to the ground voltage Vss, the analog-to-digital converter 104 outputs data bits of the digital audio signal when the clock signal CLK oscillates to a logic low level.

Figure 3:
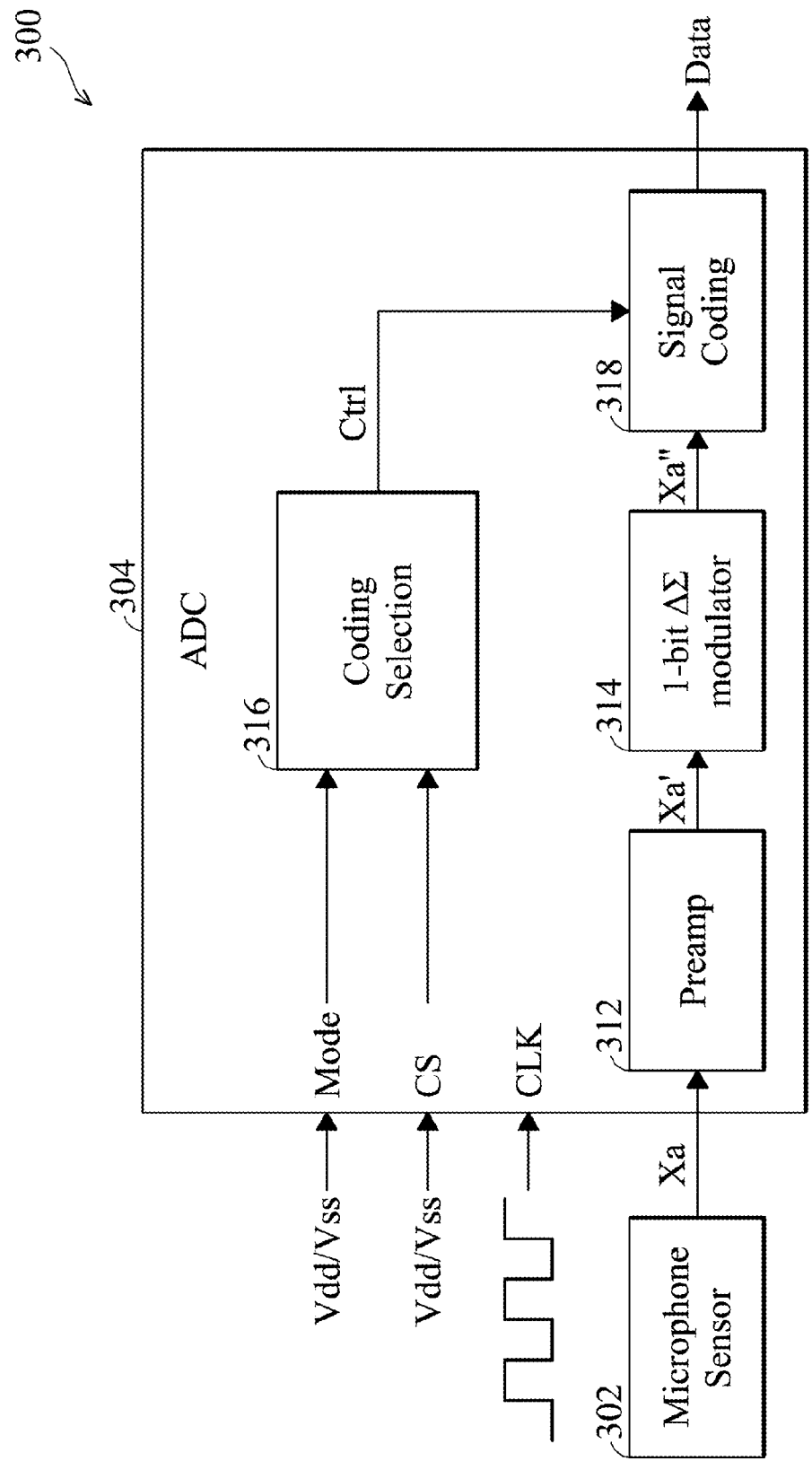
FIG. 3 is a block diagram of an analog-to-digital converter according to the invention.

Referring to FIG. 3, a block diagram of an analog-to-digital converter 304 according to the invention is shown. The analog-to-digital converter (ADC) 304 has four input terminals and an output terminal. Input terminals Mode and CS can be coupled to a voltage source Vdd or a ground voltage Vss. A mode signal and a channel selection signal CS are then respectively obtained via the input terminals Mode and CS. When the input terminal Mode is coupled to the voltage source Vdd, the mode signal is at a logic high level to indicate that an encoding mode has been selected. When the input terminal Mode is coupled to the ground voltage Vss, the mode signal is at a logic low level to indicate that the encoding mode has not been selected. An input terminal CLK receives a clock signal which periodically oscillates between a logic high level and a logic low level. A microphone sensor 302 detects a sound pressure to generate an analog audio signal Xa. The analog-to-digital converter 304 then receives the audio signal Xa from the microphone sensor 302 and processes the analog audio signal Xa according to the mode signal to generate a digital audio signal. The analog-to-digital converter 304 then outputs data of the digital audio signal according to the channel selection signal CS and the clock signal via an output terminal.

In one embodiment, the analog-to-digital converter 304 comprises a pre-amplifier 312, a 1-bit ΔΣ modulator 314, a signal coding module 318, and a coding selection module 316. The pre-amplifier 312 amplifies the analog audio signal Xa to obtain an amplified audio signal Xa'. The 1-bit ΔΣ modulator 314 then converts the amplified audio signal Xa' from analog to digital to obtain a digital audio signal Xa". The coding selection module 316 receives the mode signal and the channel selection signal CS and then generates a control signal Ctrl according to the mode signal and the channel selection signal CS. The control signal Ctrl is then sent to the signal coding module 318. When the control signal Ctrl indicates that the encoding mode has been selected, the signal coding module 318 encodes a coded audio signal according to the digital audio signal Xa" as an output signal of the analog-to-digital converter 304. When the control signal Ctrl indicates that the encoding mode has not been selected, the signal coding module 318 directly forwards the digital audio signal Xa" generated by the 1-bit ΔΣ modulator 314 as an output signal of the analog-to-digital converter 304.

The channel selection signal CS determines a format of the output signal of the analog-to-digital converter 304. When the input terminal CS is coupled to a ground voltage Vss, the channel selection signal CS is at a logic low level. The analog-to-digital converter 304 then outputs data bits of the output signal when the clock signal oscillates to a logic low level, and does not output data bits of the output signal when the clock signal oscillates to a logic high level. In other words, the output terminal of the analog-to-digital converter 304 is switched to a high-impedance state (Z shown in FIG. 4) when the clock signal oscillates to a logic high level. When the input terminal CS is coupled to a voltage source Vdd, the channel selection signal CS is at a logic high level. The analog-to-digital converter 304 then outputs data bits of the output signal when the clock signal oscillates to a logic high level, and does not output data bits of the output signal when the clock signal oscillates to a logic low level. In other words, the output terminal of the analog-to-digital converter 304 is switched to a high-impedance state (Z shown in FIG. 4) when the clock signal oscillates to a logic low level.

Figure 4:
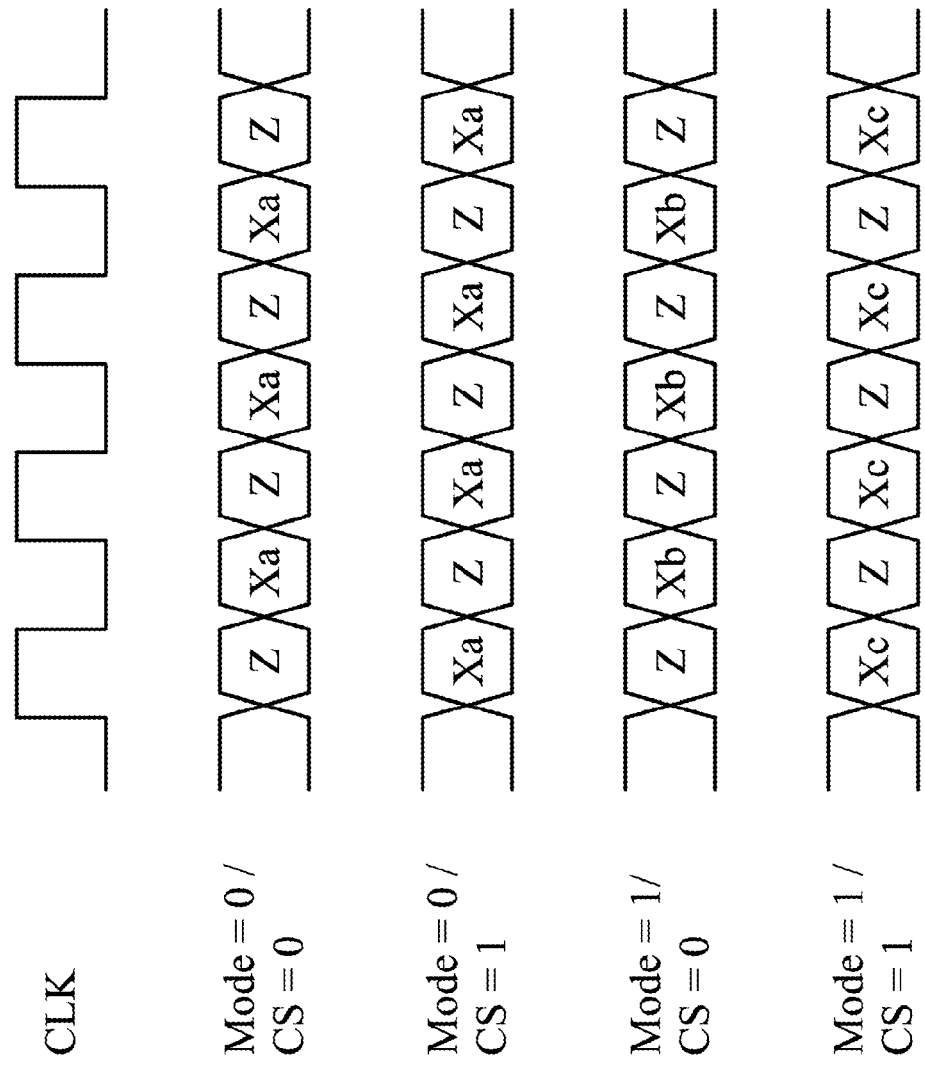
FIG. 4 is a data format diagram of an output signal of an analog-to-digital converter according to the invention.

Referring to FIG. 4, a data format diagram of an output signal of the analog-to-digital converter 304 according to the invention is shown. When the mode signal is at a logic low level, an encoding mode is not selected, and the digital audio signal Xa" generated by the 1-bit ΔΣ modulator 314 is directly taken as an output signal of the analog-to-digital converter 304 without encoding. If the channel selection signal CS is at a logic low level, the analog-to-digital converter 304 outputs data bits of the digital audio signal Xa" when the clock signal is at the logic low level. If the channel selection signal CS is at a logic high level, the analog-to-digital converter 304 outputs data bits of the digital audio signal Xa" when the clock signal is at the logic high level. When the mode signal is at a logic high level, the encoding mode is selected, and the signal coding module 318 encodes a coded audio signal Xb or Xc as an output signal of the analog-to-digital converter 304. If the channel selection signal CS is at a logic low level, the analog-to-digital converter 304 outputs data bits of the coded audio signal Xb when the clock signal is at the logic low level. If the channel selection signal CS is at a logic high level, the analog-to-digital converter 304 outputs data bits of the coded audio signal Xc when the clock signal is at the logic high level. The signal coding module 318 performs different encoding processes to encode different coded audio signals Xb and Xc when the channel selection signal CS is at different levels.

The signal coding module 318 performs an encoding process in a variety of ways comprising offset adjustment, gain adjustment, phase adjustment, and delay adjustment. In one embodiment, the signal coding module 318 adds a positive offset value to the digital audio signal Xa" to obtain the coded audio signal if the channel selection signal CS is at a logic low level, and the signal coding module 318 adds a negative offset value to the digital audio signal Xa" to obtain the coded audio signal if the channel selection signal CS is at a logic high level. In another embodiment, the signal coding module 318 multiplies the digital audio signal Xa" by a first multiplier to obtain the coded audio signal if the channel selection signal CS is at a logic low level, and the signal coding module 318 multiplies the digital audio signal Xa" by a second multiplier to obtain the coded audio signal if the channel selection signal CS is at a logic high level, wherein the first multiplier is greater than 1 and the second multiplier is smaller than 1.

In another embodiment, the signal coding module 318 does not alter the phase of the digital audio signal Xa" if the channel selection signal CS is at a logic low level, and the signal coding module 318 inverts the phase of the digital audio signal Xa" to obtain the coded audio signal if the channel selection signal CS is at a logic high level. In another embodiment, the signal coding module 314 delays the digital audio signal Xa" to obtain the coded audio signal if the channel selection signal CS is at a logic low level, and the signal coding module 314 does not delay the digital audio signal Xa" if the channel selection signal CS is at a logic high level.

Figure 5:
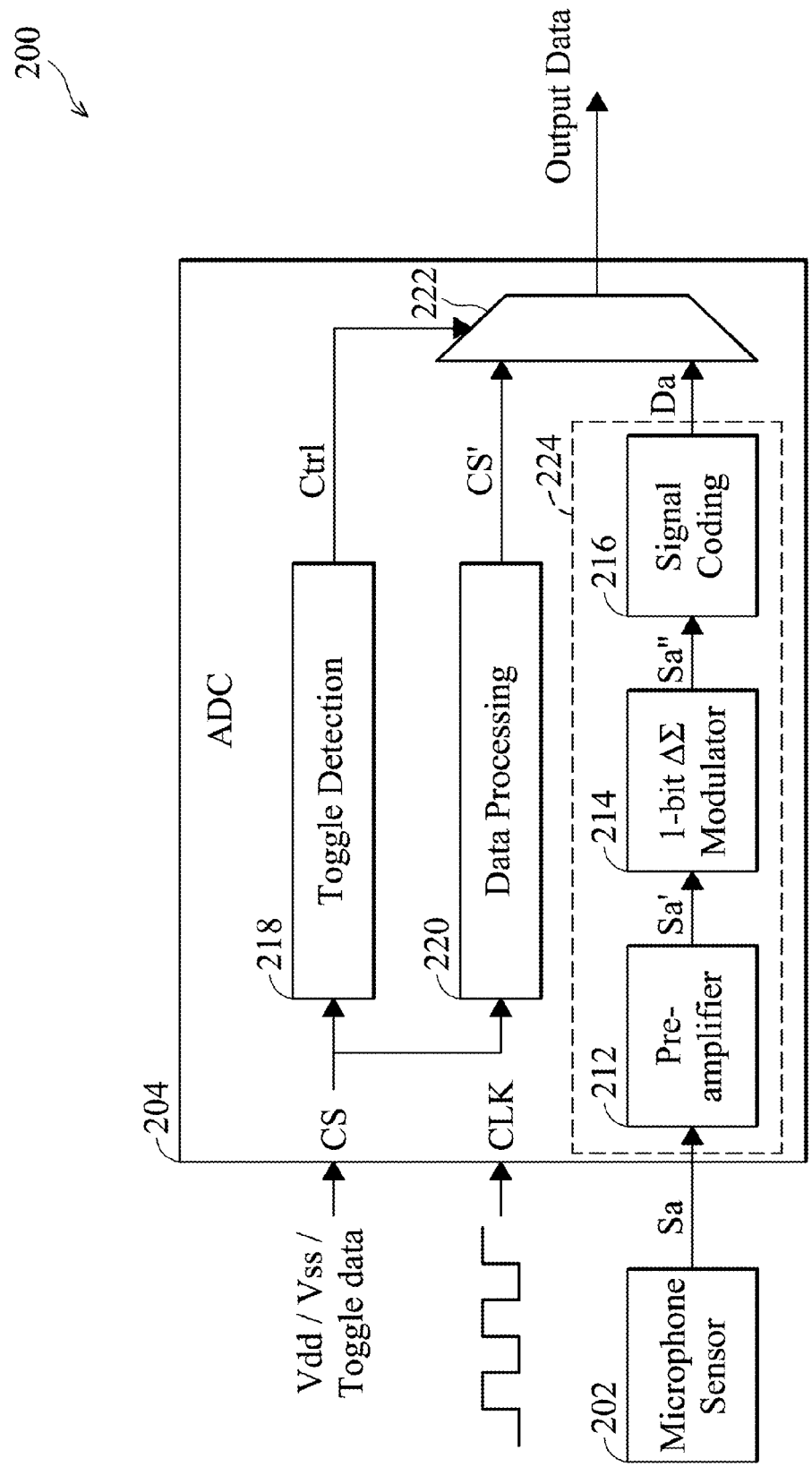
FIG. 5 is a block diagram of an analog-to-digital converter according to the invention.

Referring to FIG. 5, a block diagram of an analog-to-digital converter 204 according to the invention is shown. The analog-to-digital converter 204 has three input terminals. A channel selection terminal CS may be coupled to a voltage source Vdd of a logic high level or a ground voltage Vss of a logic low level. The channel selection terminal CS may also receive a data signal toggling between the logic low level and the logic high level. A clock terminal receives a clock signal CLK oscillating between the logic low level and the logic high level. A microphone sensor 202 detects sound pressure to generate an analog audio signal Sa. The analog-to-digital converter 204 then receives the analog audio signal from the microphone sensor 202 and processes the analog-audio signal.

In one embodiment, the analog-to-digital converter 204 comprises a toggle detection module 218, two data processing module 220 and 224, and a multiplexer 222. A channel selection signal CS received from the channel selection input terminal is sent to both the toggle detection module 218 and the data processing module 220. The toggle detection module 218 determines whether the channel selection signal CS is toggling between a logic high level and a logic low level to generate a control signal Ctrl. If the voltage of the channel selection signal CS switches between the logic low level and the logic high level at a frequency higher than a threshold, the toggle detection module 218 determines that the channel selection signal Cs is toggling. Thus, when the channel selection input terminal is coupled to the voltage source Vdd or the ground voltage Vss, the channel selection signal CS stays at the logic high level or the logic low level, and the toggle detection module 218 determines that the channel selection signal CS is not toggling. When the channel selection signal CS is a received data signal rather than the logic low level of the ground voltage Vss or the logic high level of the voltage source Vdd, the channel selection signal CS changes between the logic low level and the logic high level with the bit values thereof, and the toggle detection module 218 determines that the channel selection signal CS is toggling.

The data processing module 220 processes the channel selection signal CS to generate a processed channel selection signal CS'. In one embodiment, the data processing module 220 inverts values of data bits of the channel selection signal CS to obtain the processed channel selection signal CS'. The data processing module 224 receives the analog audio signal Sa from the microphone sensor 202 and converts the analog audio signal Sa to a digital audio signal Da. In one embodiment, the data processing module 224 comprises a pre-amplifier 212, a 1-bit $\Delta\Sigma$ modulator 214, and a signal coding module 216. The pre-amplifier 212 amplifies the analog audio Sa to obtain an amplified audio signal Sa'. The 1-bit $\Delta\Sigma$ modulator 214 then converts the amplified audio signal Sa' from analog to digital to obtain a digital audio signal Sa". The signal coding module 216 then encodes a coded audio signal Da according to the digital audio signal Sa".

The signal coding module 216 encodes the coded audio signal Da according to the digital audio signal Sa" or directly bypasses the digital audio signal Sa" as the coded audio signal Da. When the channel selection signal CS is coupled to the high voltage source Vdd or the ground voltage Vss, the signal coding module 216 directly bypasses the digital audio signal Sa" as the coded audio signal Da without encoding. When the toggle detection module 218 determines that the channel selection signal CS is toggling, the signal coding module 216 encodes the coded audio signal Da according to the digital audio signal Sa". The signal coding module 216 may encode the coded audio signal Da in a variety of ways. In one embodiment, the signal coding module 216 adds a DC offset value to the digital audio signal Sa" to obtain the coded audio signal Da. In another embodiment, the signal coding module 216 multiplies the digital audio signal Sa" by a multiplier value to obtain the coded audio signal Da. In another embodiment, the signal coding module 216 inverts the data bit values of the digital audio signal Sa" to obtain the coded audio signal Da. In another embodiment, the signal coding module 216 delays the digital audio signal Sa" by a delay period to obtain the coded audio signal Da.

The multiplexer 222 then generates an output signal of the analog-to-digital converter 204 according to the control signal Ctrl. Referring to FIG. 6, output data bits of the analog-to-digital converter corresponding to different input values of the channel selection signal according to the invention is shown. If the control signal Ctrl indicates that the channel selection signal CS stays at the logic low level, the multiplexer 222 outputs the data bits of the coded audio signal Da when the clock signal CLK oscillates to the logic low level. When the clock signal CLK oscillates to the logic high level, the multiplexer 222 does not output data bits of the coded audio signal Da, and the output terminal of the analog-to-digital converter 204 is switched to a high-impedance state (tri-state). On the contrary, if the control signal Ctrl indicates that the channel selection signal CS stays at the logic high level, the multiplexer 222 outputs the data bits of the coded audio signal Da when the clock signal CLK oscillates to the logic high level. When the clock signal CLK oscillates to the logic low level, the multiplexer 222 does not output data bits of the coded audio signal Da, and the output terminal of the analog-to-digital converter 204 is switched to the high-impedance state. If the control signal Ctrl indicates that the channel selection signal is toggling between the logic low level and the logic high level, the multiplexer 222 outputs data bits of the processed channel selection signal CS' when the clock signal CLK oscillates to the logic low level, and outputs data bits of the coded audio signal Da when the clock signal CLK oscillates to the logic high level.

Figure 7:
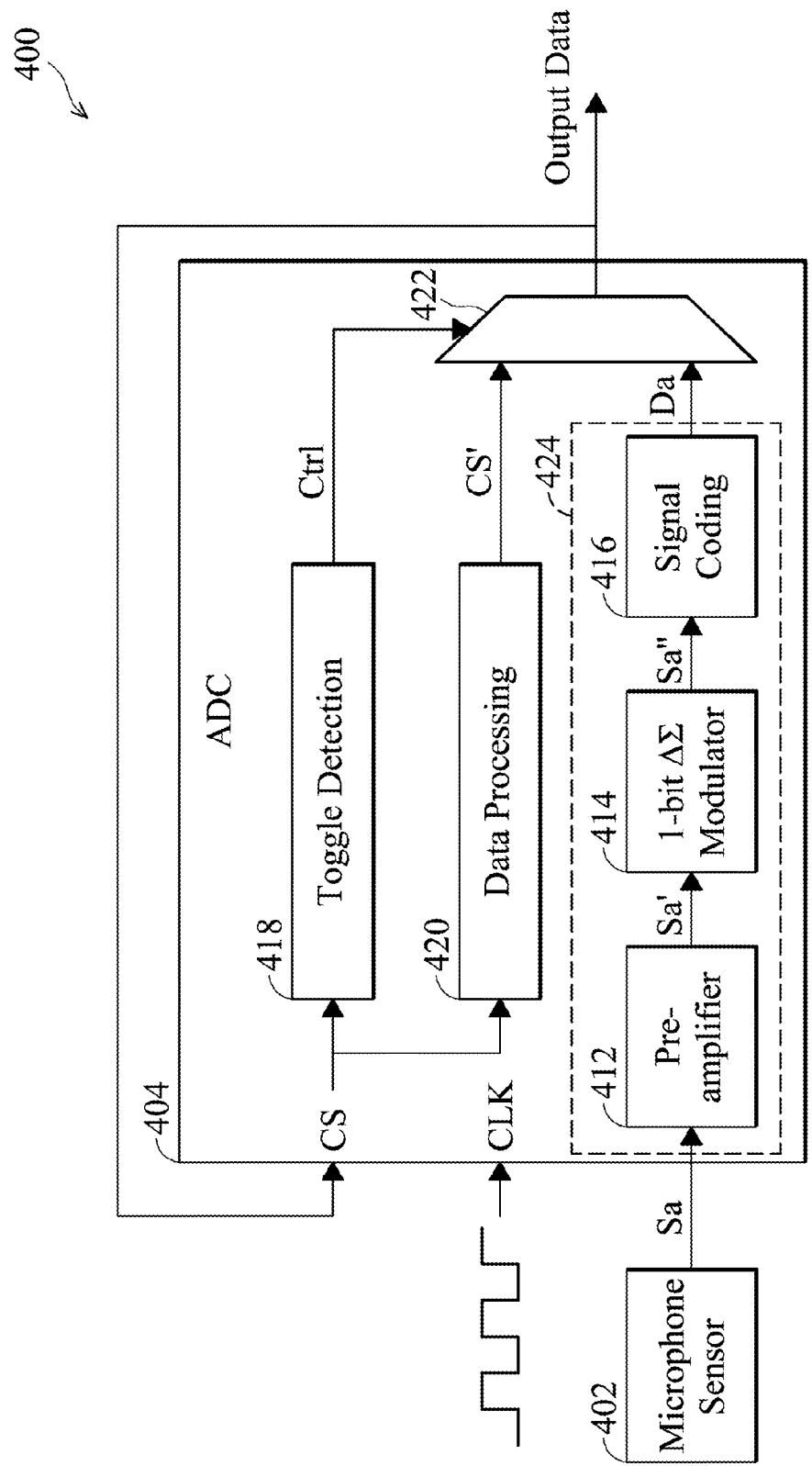
FIG. 7 is a schematic diagram of an analog-to-digital converter with a feedback channel selection input according to the invention.
Figure 8:
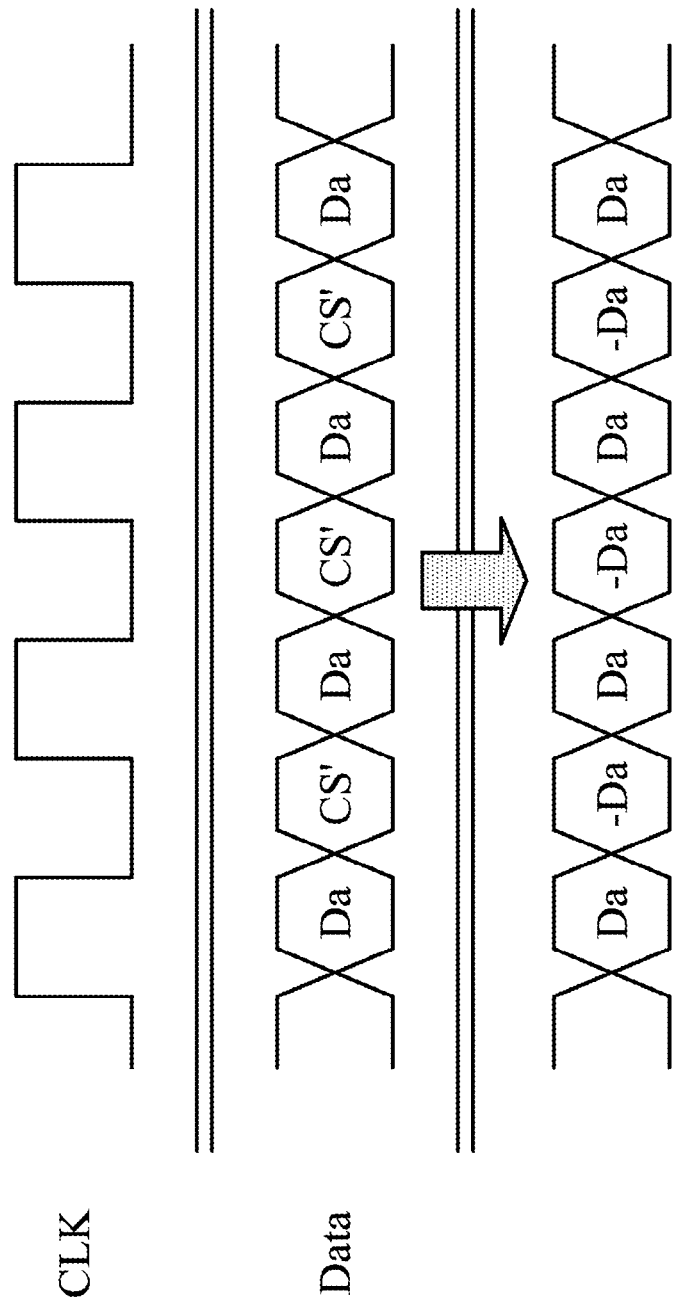
FIG. 8 shows output data of an analog-to-digital converter corresponding to different clock values.

In one embodiment, the output signal of the analog-to-digital converter 204 shown in FIG. 5 is forwarded to the channel selection input terminal as the channel selection signal CS. Referring to FIG. 7, a schematic diagram of an analog-to-digital converter 404 with a feedback channel selection input is shown. The analog-to-digital converter 404 has the same circuit structure and operations as those of the analog-to-digital converter 204 shown in FIG. 5. The output signal of the analog-to-digital converter 404 is feedback as the input of the channel selection signal CS. Because the output signal of the analog-to-digital converter 404 is a digital audio signal switching between the logic high level and the logic low level, the toggle detection module 418 determines that the channel selection signal CS is toggling between the logic high level and the logic low level. The multiplexer 422 therefore outputs data bits of the coded audio signal Da when the clock signal CLK oscillates to the logic low level, and outputs data bits of the processed channel selection signal CS' when the clock signal CLK oscillates to the logic high level, as shown in FIG. 8. If the data processing module 420 inverts the bit values of the data bits of the channel selection signal CS to generate the data bits of the processed channel selection signal CS', the values of the data bits of the processed channel selection signal CS' are equal to inverted data bits −Da of the coded audio signal Da, as shown in FIG. 8. The analog-to-digital converter 404 therefore outputs data bits Da of the coded audio signal when the clock signal oscillates to the logic high level, and outputs inverted data bits −Da of the coded audio signal when the clock signal oscillates to the logic low level.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An analog-to-digital converter, receiving a first audio signal from a microphone sensor, and receiving a first channel selection signal and a clock signal, comprising:
   a toggle detection module, detecting whether the first channel selection signal is toggling between a logic low level and a logic high level to generate a control signal;
   a first data processing module, processing the first channel selection signal to generate a second channel selection signal;
   a second data processing module, converting the first audio signal from analog to digital to generate a second audio signal; and
   a multiplexer, if the control signal indicates that the first channel selection signal is toggling between the logic low level and the logic high level, outputting data bits of the second channel selection signal as an output signal of the analog-to-digital converter when the clock signal oscillates to the logic low level, and outputting data bits of the second audio signal as the output signal of the analog-to-digital converter when the clock signal oscillates to the logic high level.

2. The analog-to-digital converter as claimed in claim 1, wherein the second data processing module comprises:
   a pre-amplifier, amplifying the first audio signal to obtain a third audio signal;
   a 1-bit ΔΣ modulator, converting the third audio signal from analog to digital to obtain a fourth audio signal; and
   a signal coding module, encoding the second audio signal according to the fourth audio signal when the control signal indicates that the first channel selection signal is toggling, and bypassing the fourth audio signal as the second audio signal when the control signal indicates that the first channel selection signal is not toggling.

3. The analog-to-digital converter as claimed in claim 1, wherein if the control signal indicates that the first channel selection signal stays at the logic low level, the multiplexer outputs the data bits of the second audio signal as the output signal of the analog-to-digital converter when the clock signal oscillates to the logic low level, and the output terminal of the analog-to-digital converter is switched to a high-impedance state when the clock signal oscillates to the logic high level.

4. The analog-to-digital converter as claimed in claim 1, wherein if the control signal indicates that the first channel selection signal is remaining at the logic high level, the multiplexer outputs the data bits of the second audio signal as the output signal of the analog-to-digital converter when the clock signal oscillates to the logic high level, and the output terminal of the analog-to-digital converter is switched to a high-impedance state when the clock signal oscillates to the logic low level.

5. The analog-to-digital converter as claimed in claim 1, wherein the output signal of the analog-to-digital converter is fed back as the first channel selection signal.

6. The analog-to-digital converter as claimed in claim 1, wherein the first data processing module inverts the values of the data bits of the first channel selection signal to obtain the data bits of the second channel selection signal.

7. The analog-to-digital converter as claimed in claim 2, wherein the signal coding module adds a DC offset value to the fourth audio signal to obtain the second audio signal.

8. The analog-to-digital converter as claimed in claim 2, wherein the signal coding module multiplies the fourth audio signal by a multiplier value to obtain the second audio signal.

9. The analog-to-digital converter as claimed in claim 2, wherein the signal coding module delays the fourth audio signal by a delay period to obtain the second audio signal.

10. An analog-to-digital conversion method, wherein an analog-to-digital converter comprises a toggle detection module, a first data processing module, a second data processing module, and a multiplexer, comprising:
    receiving a first audio signal from a microphone sensor;
    receiving a first channel selection signal and a clock signal;
    detecting whether the first channel selection signal is toggling between a logic low level and a logic high level with a toggle detection module to generate a control signal;
    processing the first channel selection signal with the first data processing module to generate a second channel selection signal;
    converting the first audio signal from analog to digital with the second data processing module to generate a second audio signal; and
    if the control signal indicates that the first channel selection signal is toggling between the logic low level and the logic high level, outputting data bits of the second channel selection signal with the multiplexer as an output signal of the analog-to-digital converter when the clock signal oscillates to the logic low level, and outputting data bits of the second audio signal with the multiplexer as the output signal of the analog-to-digital converter when the clock signal oscillates to the logic high level.

11. The analog-to-digital conversion method as claimed in claim 10, wherein the second data processing module comprises a pre-amplifier, a 1-bit ΔΣ modulator, and a signal coding module, and processing of the first audio signal comprises:
    amplifying the first audio signal with the pre-amplifier to obtain a third audio signal;
    converting the third audio signal from analog to digital with the 1-bit ΔΣ modulator to obtain a fourth audio signal; and
    encoding the second audio signal with the signal coding module according to the fourth audio signal.

12. The analog-to-digital conversion method as claimed in claim 10, wherein the method further comprises:
    if the control signal indicates that the first channel selection signal stays at the logic low level, outputting the data bits of the second audio signal with the multiplexer as the output signal of the analog-to-digital converter when the clock signal oscillates to the logic low level, and switching the output terminal of the analog-to-digital converter to a high-impedance state when the clock signal oscillates to the logic high level.

13. The analog-to-digital conversion method as claimed in claim 10, wherein the method further comprises:
    if the control signal indicates that the first channel selection signal is remaining at the logic high level, outputting the data bits of the second audio signal with the multiplexer as the output signal of the analog-to-digital converter when the clock signal oscillates to the logic high level, and switching the output terminal of the analog-to-digital converter to a high-impedance state when the clock signal oscillates to the logic low level.

14. The analog-to-digital conversion method as claimed in claim 10, wherein the method further comprises:

feeding the output signal of the analog-to-digital converter back to the input of the analog-to-digital converter as the first channel selection signal.

15. The analog-to-digital conversion method as claimed in claim 10, wherein processing of the first channel selection signal comprises:

inverting the data bits of the first channel selection signal with the first data processing module to obtain the data bits of the second channel selection signal.

16. The analog-to-digital conversion method as claimed in claim 11, wherein encoding of the second audio signal comprises:

adding a DC offset value to the fourth audio signal with the signal coding module to obtain the second audio signal.

17. The analog-to-digital conversion method as claimed in claim 11, wherein encoding of the second audio signal comprises:

multiplying the fourth audio signal by a multiplier value with the signal coding module to obtain the second audio signal.

18. The analog-to-digital conversion method as claimed in claim 11, wherein encoding of the second audio signal comprises:

delaying the fourth audio signal by a delay period with the signal coding module to obtain the second audio signal.

* * * * *